(12) United States Patent
Wang

(10) Patent No.: US 7,598,096 B2
(45) Date of Patent: Oct. 6, 2009

(54) METHODS OF FORMING FERROELECTRIC CRYSTALS AS STORAGE MEDIA AND STRUCTURES FORMED THEREBY

(75) Inventor: Li-Peng Wang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 407 days.

(21) Appl. No.: 11/644,804

(22) Filed: Dec. 22, 2006

(65) Prior Publication Data
US 2008/0152884 A1 Jun. 26, 2008

(51) Int. Cl.
H01L 21/00 (2006.01)
G11B 9/02 (2006.01)
G11C 11/22 (2006.01)

(52) U.S. Cl. .............. 438/3; 369/126; 365/145
(58) Field of Classification Search .............. 438/3; 365/145; 369/126
See application file for complete search history.

(56) References Cited

U.S. PATENT DOCUMENTS

| 5,985,404 | A * | 11/1999 | Yano et al. ............... 428/846.1 |
| 6,121,647 | A * | 9/2000 | Yano et al. ............... 257/295 |
| 6,841,220 | B2 * | 1/2005 | Onoe et al. ............... 428/66.7 |
| 7,276,173 | B2 * | 10/2007 | Onoe et al. ............... 216/22 |
| 2003/0071878 | A1 * | 4/2003 | Murai ............... 347/68 |
| 2003/0186090 | A1 * | 10/2003 | Onoe et al. ............... 428/701 |
| 2005/0098532 | A1 * | 5/2005 | Onoe et al. ............... 216/22 |
| 2006/0207713 | A1 * | 9/2006 | Eun et al. ............... 156/153 |

* cited by examiner

Primary Examiner—Evan Pert
(74) Attorney, Agent, or Firm—Kathy Ortia on behalf of Intel Corporation

(57) ABSTRACT

Methods and associated structures of forming a microelectronic device are described. Those methods may comprise forming a conductive layer on a single crystal ferroelectric material, patterning the conductive layer to form contacts, attaching a portion of a circuit on the patterned conductive layer, lapping the single crystal ferroelectric material to a thickness of about 1 to about 10 microns and then etching the single crystal to a thickness below about 25 nm.

15 Claims, 4 Drawing Sheets

METHODS OF FORMING FERROELECTRIC CRYSTALS AS STORAGE MEDIA AND STRUCTURES FORMED THEREBY

BACKGROUND OF THE INVENTION

Ferroelectric thin films based on domain switching have been demonstrated to be a promising media for Probe-Based Data Storage (PDS) based data storage devices. Both single and polycrystalline ferroelectric thin films have been investigated. In some cases, the smallest bit size (or data density) may be limited by the domain size for single crystal films, and by the grain size for poly-crystalline films. For ferroelectric thin films, scaling of switchable domain size (or bit size) below about 25 nm becomes very difficult due to defects in the grown thin films.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
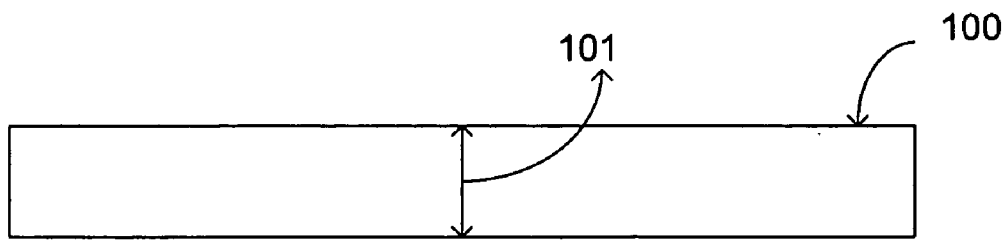
FIGS. 1a-1g represent structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods may comprise forming a conductive layer on a single crystal ferroelectric material, patterning the conductive layer to form contacts, attaching a portion of a circuit on the patterned conductive layer, lapping the single crystal ferroelectric material to a thickness of about 1 to about 10 microns and then etching the single crystal to a thickness of about 25 nm or below. Methods of the present invention may decrease the bit size of ferroelectric devices below about 15 nm.

FIGS. 1a-1g illustrate an embodiment of a method of forming single crystal ferroelectric structures for use in data storage, such as in probe-based data storage (PDS) devices, for example. FIG. 1a illustrates a cross-section of a portion of a single crystal ferroelectric material 100. The single crystal ferroelectric material 100 may comprise at least one of Lithium Tantalate (LT) and Lithium Niobate (LNO). In one embodiment, the single crystal ferroelectric material 100 may comprise a wafer of the single crystal ferroelectric material 100.

Figure 1B:
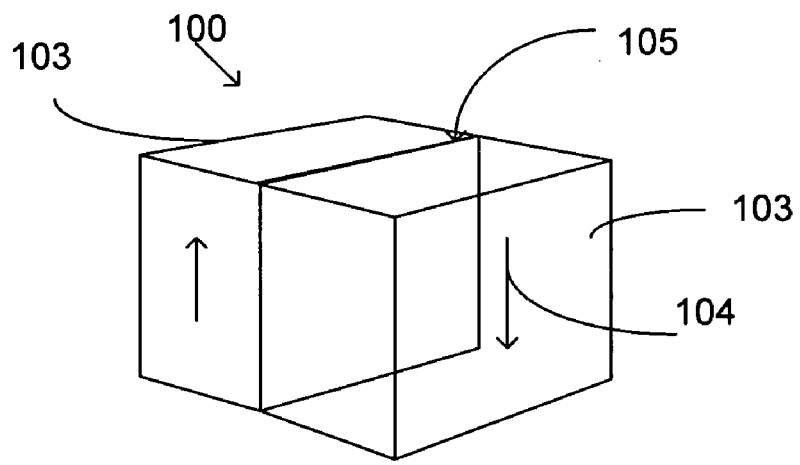

The single crystal ferroelectric material 100 tends to comprise a greater number of textured single domains 103 and tends to comprise less defects as compared to polycrystalline or epitaxial thin film ferroelectric materials (FIG. 1b). The single crystal ferroelectric material 100 may comprise a domain wall 105 that may separate individual domain regions 103. The single crystal ferroelectric material 100 may comprise very sharp distinct domain walls 105. In one embodiment, the domain 103 may hold 1 bit of information. The domains 103 may have an orientation 104 that in some cases may be normal to the surface of the thin film ferroelectric material 106.

In one embodiment, a thickness 101 of the single crystal ferroelectric material 100 may comprise between about 0.5 mm to about 1.5 mm, but will depend upon the application. Any suitable method of forming the single crystal ferroelectric material 100 may be employed. In one embodiment, the single crystal ferroelectric material 100 may comprise low defects.

Figure 1C:
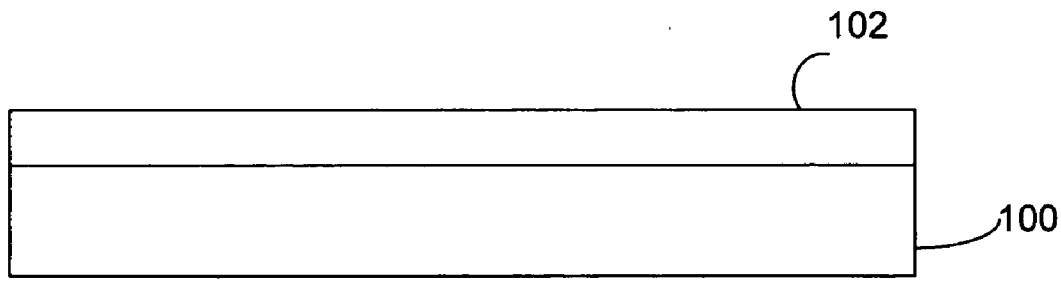
Figure 1D:
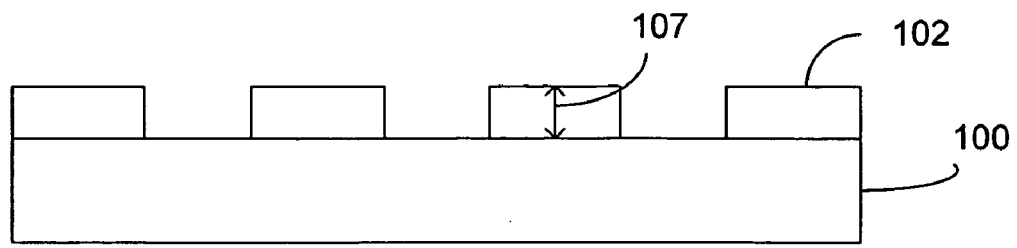

A conductive layer 102, may be formed on the single crystal ferroelectric material 100 (FIG. 1c). The conductive layer 102 may comprise any type of conductive material, and in some cases may comprise a material that may function as an electrode, such as copper or conducting metal oxide (Sr-RuO$_3$) for example. In one embodiment, the conductive layer 102 may comprise a thickness 107 ranging from 15 to 50 nm. The conductive layer 102 may be patterned (FIG. 1d). The shape of the patterned conductive material 102 may depend upon the particular application, but may be patterned according to electrode patterning requirements for a PDS circuit, in some embodiments.

Figure 1E:
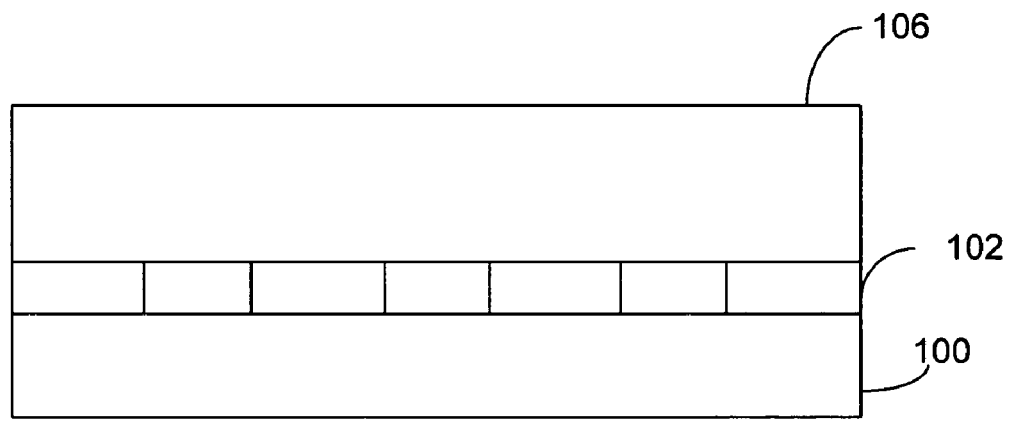

In one embodiment, a substrate 106 may be bonded to the patterned conductive layer 102 (FIG. 1e). The substrate 106 may be bonded utilizing any suitable bonded technique, depending upon the particular application. The substrate 106 may comprise a wafer in some embodiments, and may comprise circuitry for PDS functions, including but not limited to reading and writing functions. In one embodiment, the substrate 106 may comprise at least one of writing nano-pulse circuitry and reading amplifier circuitry, and the like.

In one embodiment, the substrate 106 may comprise a CMOS microelectronic wafer, which may comprise a diameter suitable for the particular application. In some embodiments, the single crystal ferroelectric material 100 may comprise at least one wafer of single crystal ferroelectric material 100. In one embodiment, the single crystal ferroelectric material 100 may comprise multiple wafers, for example, of a smaller diameter than the substrate 106, so that the number of single crystal ferroelectric materials 100 (i.e., the number of wafers in this embodiment), that may fit on the substrate 106 may be optimized/maximized.

Figure 1F:
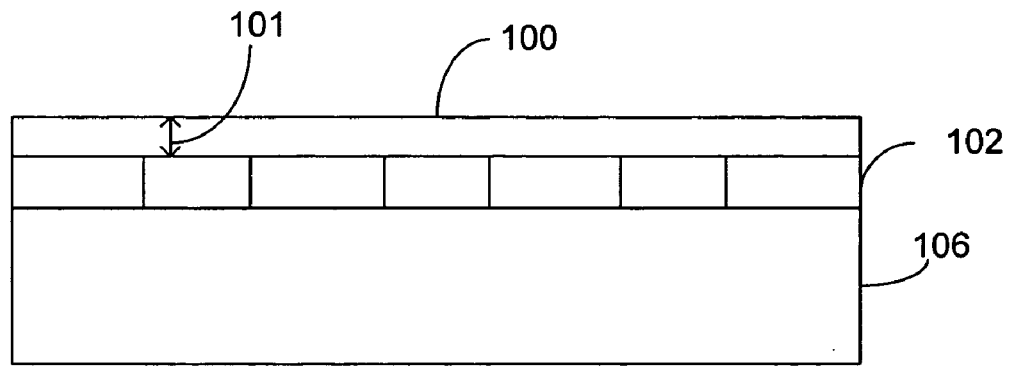

In one embodiment, the single crystal ferroelectric material 100 may be lapped (i.e., a portion of the single crystal ferroelectric material 100 may be removed) using any suitable lapping, grinding and/or removal process, such as but not limited to chemical-mechanical polishing (CMP), for example (FIG. 1f). In one embodiment, the single crystal ferroelectric material 100 may be lapped to a thickness 101 of about 1 to about 10 microns, but will depend upon the particular application.

Figure 1G:
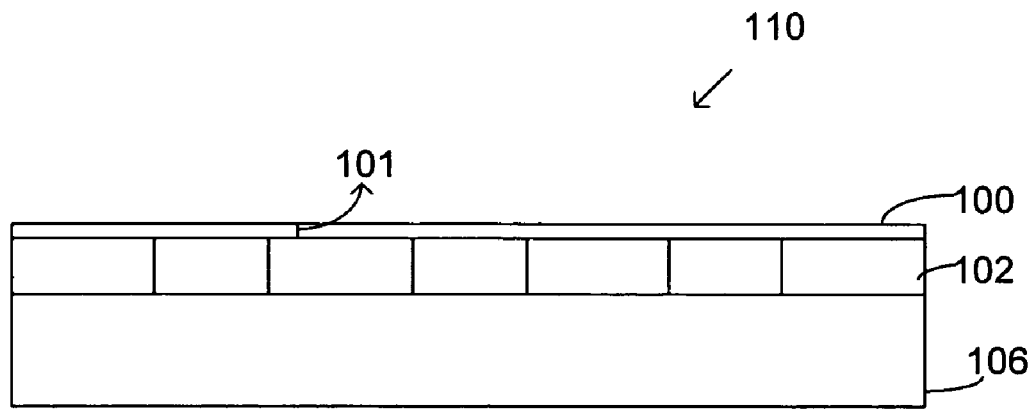

In one embodiment, the single crystal ferroelectric material 100 may be etched to further decrease its thickness 101 (FIG. 1g). In one embodiment, the single crystal ferroelectric material 100 may be etched to a thickness 101 of about 25 nm or less, but will depend upon the particular application. In one embodiment, the thickness 101 may comprise about 15 nm or less. In one embodiment, the single crystal ferroelectric material 100 may be etched utilizing a reactive ion etch (RIE) process, an ECR (electron cyclotron resonance) etch process, and various other etch processes, but may be etched utilizing any suitable etching process according to the particular application.

In some embodiments, the thickness 101 of the single crystal ferroelectric material may be comparable to a dot size i.e., a single domain of the single crystal ferroelectric material 100 that may be read or written to in a memory storage related circuit, such as but not limited to a PDS circuit, for example. The high quality, low defect single crystal ferroelectric material enables the scaling of the bit size of a storage media device, such as but not limited to an PDS related device, to about 15 nm or below. In one embodiment, the single crystal ferroelectric material 100, the patterned conductive material 102 and the substrate 106 may comprise a single crystal ferroelectric storage device 110.

Figure 2:
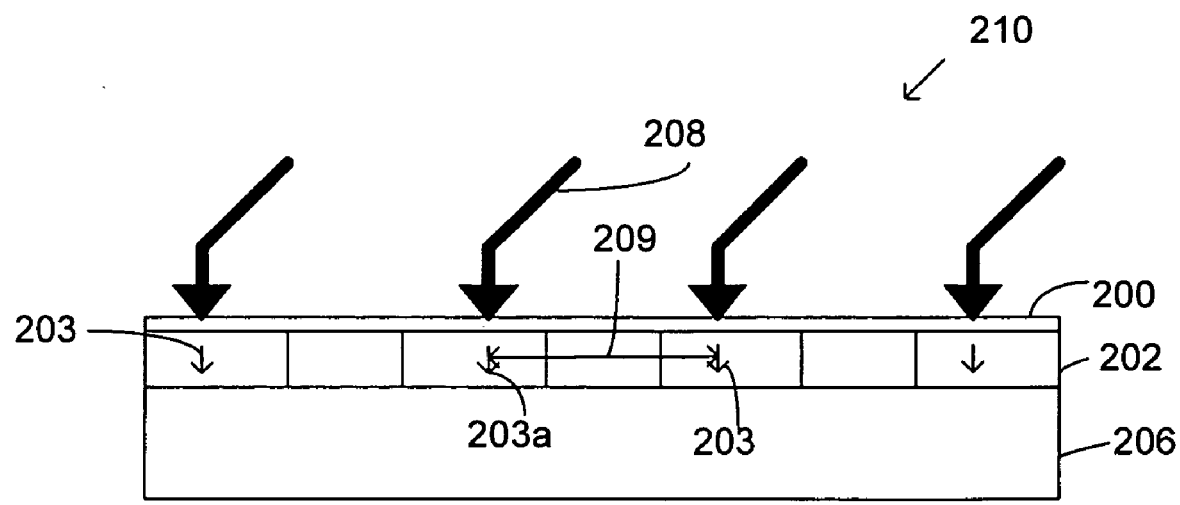
FIG. 2 represent structures according to an embodiment of the present invention.

Referring to FIG. 2, at least one probe 208, such as but not limited to a scanning probe microscopic (SPM), as is known in the art, may be placed in contact and/or proximity with a single crystal ferroelectric storage device 210, similar to the single crystal ferroelectric storage device 110 of FIG. 1g, for example. In one embodiment, the single crystal ferroelectric storage device 110 may comprise a patterned conductive material 202, a substrate 206 that may comprise a wafer, such as but not limited to a CMOS wafer, and a single crystal ferroelectric material 200. The single crystal ferroelectric material 200 may comprise a thickness of less than about 25 nm, in some cases.

The at least one probe 208 may be in contact and/or proximity with a domain 203, which may be located within the single crystal ferroelectric material 200. Each individual domain 203 of the single crystal ferroelectric material 200 may hold 1 bit of information. A pitch 209 between adjacent domains (for example, 203 and 203a in FIG. 2) may comprise 25 nm and below, in some cases.

The at least one probe 208 may be coupled to an electric field source, which when applied to the at least one probe 208 in contact with the domain 103 may serve to switch the orientation of the domain 203 by 180 degrees. In this manner, the domains 203 of the single crystal ferroelectric material 200 may be written to, read and/or programmed, depending upon the orientation of the domain, i.e., 180 degree switching of the domain by the at least one probe 208 may correspond to a 0 or a 1 bit value stored within the domain location, in some cases.

In one embodiment, the a read operation of the information stored in the domain 203 (bit) of the single crystal ferroelectric material 200 may comprise contacting and/or passing the at least one probe 208 over the surface of the single crystal ferroelectric material 200 and applying a electric field between the at least one probe and the patterned conductive material 202. In one embodiment, the at least one probe 208 is capable of sensing a change in polarization of the domain 203 when it is over or near the domain 203. When the at least one probe 208 senses the change in polarization, the at least one probe 208 (which is coupled to appropriate electronic equipment not shown in the figure), in some embodiments may register the data bit as a 1 or a 0, as the case may be.

In one embodiment, the at least one probe can move about 1 nm to access and switch adjacent domains 203 within the single crystal ferroelectric material 200. The smallest switchable dot size (i.e., roughly the size of the probe resolution of the single domains) of the single crystal ferroelectric material 200 can be scaled to correspond with the probe reading capabilities, i.e., well below 25 nm and may approach 1 nm in some cases, because of the superior material properties of the single crystal ferroelectric material. Therefore, integration of single ferroelectric crystal material into PDS systems extends the scaling of the bit size below about 15 nm, and thus increases the storage capacity of various memory applications, such as in mini hard disks, SPM related applications and various MEMS related devices.

In one embodiment, the thickness of the single crystal ferroelectric material 200 is comparable to the dot size of the at least one probe 208. In one embodiment, the single crystal ferroelectric material 200 comprises a thickness of less than about 25 nm, and the dot size comprises a thickness below about 25 nm. In some embodiments, it is advantageous to have the thickness of the single crystal ferroelectric material 200 comparable to the dot size, so that as an electric field is applied to the single crystal ferroelectric storage device 210 (during a writing operation, for example), the domains would spread laterally, as well as vertically. This lateral growth of the domain 203 may result in enhanced performance of the single crystal ferroelectric storage device 210, by increasing storage capacity, for example.

Figure 3:
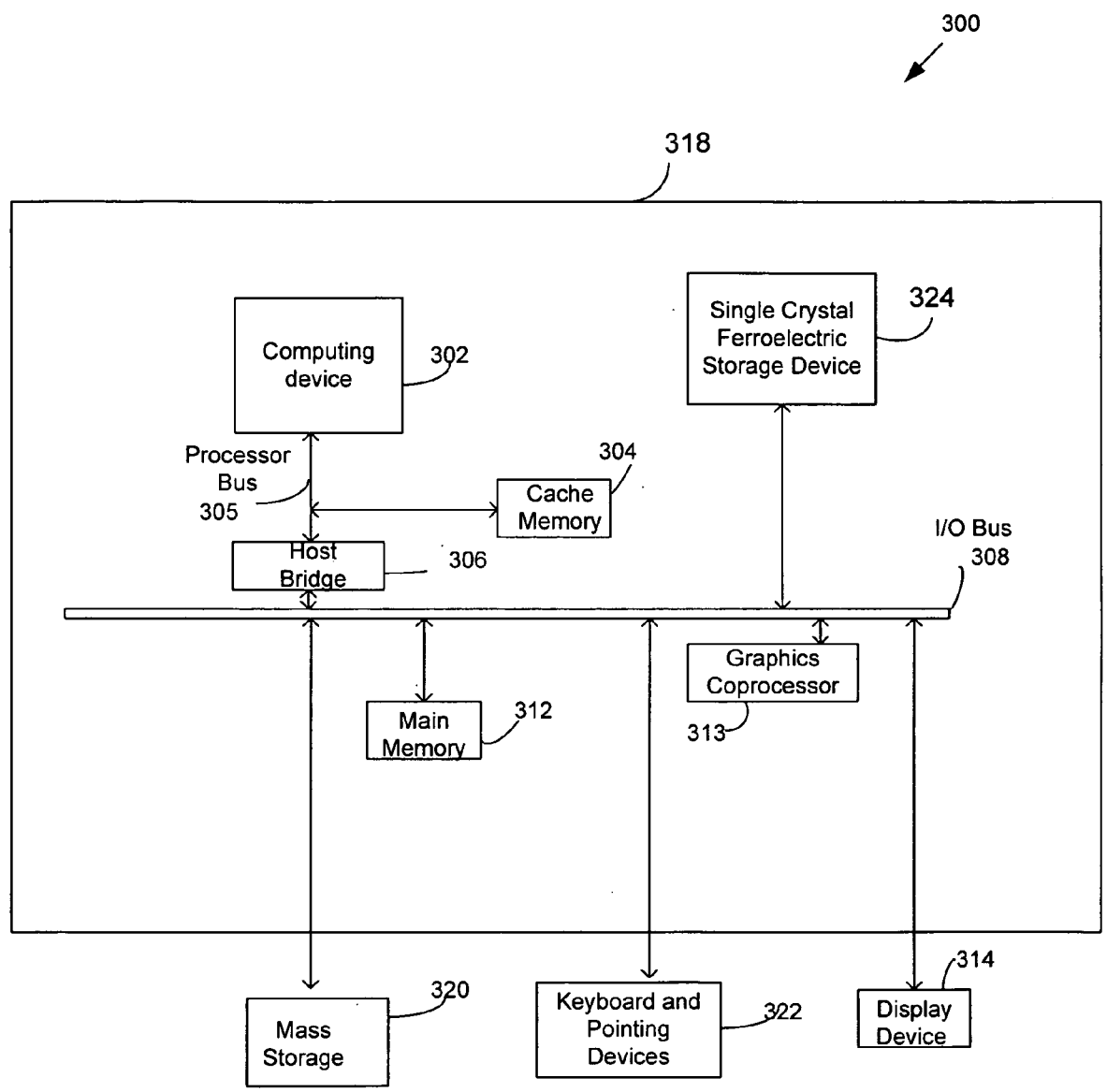
FIG. 3 represents a system according to an embodiment of the present invention.

FIG. 3 is a diagram illustrating an exemplary system 300 capable of being operated with methods for fabricating a microelectronic structure, such as the single crystal ferroelectric storage device 110 of FIG. 1g, for example. It will be understood that the present embodiment is but one of many possible systems in which the various embodiments of the single crystal ferroelectric storage device of the present invention may be used.

In the system 300, the single crystal ferroelectric storage device 324 may be communicatively coupled to a printed circuit board (PCB) 318 by way of an I/O bus 308. The communicative coupling of the single crystal ferroelectric storage device 324 may be established by physical means, such as through the use of a package and/or a socket connection to mount the single crystal ferroelectric storage device 324 to the PCB 318 (for example by the use of a chip package, interposer and/or a land grid array socket). The single crystal ferroelectric storage device 324 may also be communicatively coupled to the PCB 318 through various wireless means (for example, without the use of a physical connection to the PCB), as are well known in the art.

The system 300 may include a computing device 302, such as a processor, and a cache memory 304 communicatively coupled to each other through a processor bus 305. In one embodiment, the computing device 302 may comprise at least one single crystal ferroelectric storage device. The processor bus 305 and the I/O bus 308 may be bridged by a host bridge 306. Communicatively coupled to the I/O bus 308 and also to the single crystal ferroelectric storage device 324 may be a main memory 312. Examples of the main memory 312 may include, but are not limited to, static random access memory (SRAM) and/or dynamic random access memory (DRAM), and/or some other state preserving mediums. In one embodiment, the main memory 312 may comprise at least one single crystal ferroelectric storage device. The system 300 may also include a graphics coprocessor 313, however incorporation of the graphics coprocessor 313 into the system 300 is not necessary to the operation of the system 300. Coupled to the I/O bus 308 may also, for example, be a display device 314, a mass storage device 320, and keyboard and pointing devices 322. In one embodiment, the mass storage device 320 may comprise at least one single crystal ferroelectric storage device.

These elements perform their conventional functions well known in the art. In particular, mass storage 320 may be used to provide long-term storage for the executable instructions for a method for forming and/or utilizing single crystal ferroelectric storage devices in accordance with embodiments of the present invention, whereas main memory 312 may be used to store on a shorter term basis the executable instructions of a method for forming and/or utilizing single crystal ferroelectric storage devices in accordance with embodiments of the present invention during execution by computing device 302. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 312 may supply the computing device 302 (which may be a processor, for example) with the executable instructions for execution.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic devices, such as a microelectronic packages, are well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method comprising:
    forming a conductive layer on a single crystal ferroelectric material;
    patterning the conductive layer to form contacts;
    attaching a substrate on the patterned conductive layer;
    lapping the single crystal ferroelectric material to a thickness of about 1 to about 10 microns; and
    etching the single crystal ferroelectric material to a thickness below about 25 nm.

2. The method of claim 1 wherein the single crystal ferroelectric material comprises at least one of Lithium Tantalate and Lithium Niobate.

3. The method of claim 1 further comprising contacting at least one probe to the patterned conductive material that is capable of supplying current to the single crystal ferroelectric material, wherein a domain of the single crystal ferroelectric material is capable of being switched.

4. The method of claim 3 wherein switching domains of the single crystal ferroelectric material comprises storing data in the single crystal ferroelectric material.

5. The method of claim 3 wherein the at least one probe is capable of at least one of writing and reading data to and from said domain of the single crystal ferroelectric material.

6. The method of claim 1 wherein the patterned conductive layer comprises a thickness of less than about 25 nm.

7. The method of claim 3 wherein an electric field that is capable of being generated by the at least one probe causes the domain of the single crystal ferroelectric material to grow vertically and laterally.

8. A structure comprising:
    a patterned conductive layer disposed on a single crystal ferroelectric material; and
    a substrate disposed on the patterned conductive layer, wherein the single crystal ferroelectric material comprises a thickness below about 25 nm.

9. The structure of claim 8 wherein the single crystal ferroelectric material comprises at least one of Lithium Tantalate and Lithium Niobate.

10. The structure of claim 8 wherein the structure comprises a portion of a PDS circuit.

11. The structure of claim 8 further comprising at least one probe disposed in proximity to the single crystal ferroelectric material and is capable of switching a domain of the single crystal ferroelectric material.

12. The structure of claim 8 wherein the patterned conductive layer comprises a thickness of less than about 25 nm.

13. The structure of claim 11 wherein the at least one probe is capable of at least one of a writing operation and reading operation of data to and from the single crystal ferroelectric material.

14. The structure of claim 8 wherein the substrate comprises a wafer, wherein the wafer comprises circuitry comprising at least one of capabilities for writing to the structure and reading from the structure.

15. The structure of claim 8 wherein the thickness of the single crystal ferroelectric material is about the same as a dot size of the ferroelectric material.

\* \* \* \* \*